(12) United States Patent
Scoggins et al.

(10) Patent No.: US 11,693,036 B2
(45) Date of Patent: Jul. 4, 2023

(54) INTERVAL DATA FOR A UTILITY METER DURING A POWER OUTAGE WITHOUT A BATTERY

(71) Applicant: Honeywell International Inc., Morris Plains, NJ (US)

(72) Inventors: Sean Michael Scoggins, Rolesville, NC (US); Scott Turner Holdsclaw, Raleigh, NC (US); Mark Alan Ranta, Apex, NC (US); Raymond Hiram Kelley, Raleigh, NC (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 179 days.

(21) Appl. No.: 16/950,078

(22) Filed: Nov. 17, 2020

(65) Prior Publication Data
US 2022/0155354 A1    May 19, 2022

(51) Int. Cl.
*G01R 22/10*    (2006.01)
*G01R 22/06*    (2006.01)
*G06Q 50/06*    (2012.01)

(52) U.S. Cl.
CPC ........... *G01R 22/10* (2013.01); *G01R 22/068* (2013.01); *G06Q 50/06* (2013.01)

(58) Field of Classification Search
CPC ..................................................... G01R 22/10
See application file for complete search history.

(56) References Cited

U.S. PATENT DOCUMENTS

| | | | |
|---|---|---|---|
| 6,792,364 B2 | 9/2004 | Jonker et al. | |
| 7,539,581 B2 | 5/2009 | Swarztrauber et al. | |
| 8,244,642 B2 | 8/2012 | Moore et al. | |
| 8,739,148 B2 | 5/2014 | Worth et al. | |
| 9,068,858 B2 | 6/2015 | Kelley et al. | |
| 2013/0232373 A1* | 9/2013 | Wang | G06F 1/14 713/503 |
| 2016/0363956 A1* | 12/2016 | Moore | G06F 1/30 |
| 2019/0346506 A1* | 11/2019 | Schamber | G06Q 50/06 |

* cited by examiner

*Primary Examiner* — Hyun D Park
(74) *Attorney, Agent, or Firm* — John Maldjian; Stevens & Lee PC

(57) ABSTRACT

A utility meter includes a consumption measurement unit for generating consumption data, a meter processor, and a RTC for time stamping the consumption data to provide interval meter data during interval meter operation. A memory stores the interval meter data. The meter processor implements/initiates responsive to a power loss that suspends RTC operation, switching from interval to relative time operation where consumption data is stored as relative consumption data together with a relative time as relative meter data. Responsive power restoration and receiving a current time, the meter switches from relative time to interval meter operation. The restoration time is calculated using the current and an elapsed time since the restoration. The time of restoration and current time is used to generate calculated times. The consumption data from relative time operation is time stamped with the calculated times to provide time-corrected relative meter data that is stored to the memory.

18 Claims, 2 Drawing Sheets

INTERVAL DATA FOR A UTILITY METER DURING A POWER OUTAGE WITHOUT A BATTERY

FIELD

Disclosed aspects relate to utility meters, and more specifically to tracking of the passage of time after the utility meter loses external power, such as during a power outage.

BACKGROUND

Utility meters can may include meters for the monitoring of consumption by consumers of a wide variety of forms of energy or other commodities. Example forms of energy include commodities including electricity, a fuel gas such as natural gas or propane, water, and oil.

Timekeeping is an essential aspect of both Time of Use (TOU) and interval data recording (also called "load profile" recording) in electricity/energy metering. For TOU metering, energy usage is accounted for differently during different times of the day, and for interval data recording energy usage is measured in small periods of time that align to clock boundaries (i.e. :00, :30, :45, and :00 for 15-minute interval data periods). Utility meters generally include real-time clocks (RTCs) to maintain the correct time of day. The time base maybe in local "wall clock" time or in Coordinated Universal Time (UTC), or in some other timing system. The RTC is responsible for turning the passage of time from a time sensor (e.g., a crystal oscillator, or line frequency cycles) into updates to the familiar year, month, day, hour, minute, and second format.

Power outages or related conditions such as brown outs can occur that pose problems for utility meters. During power outages, because the utility meter can lose external power, it may not be able to track the passage of time, depending on its internal energy (or power) storage and the length of the power outage. Time updates are only possible when the utility meter's RTC remains powered and can sense the passage of time. Utility meters or communications boards associated with the utility meter may include capacitor(s) to store energy during normal meter operation, that can be used during a power outage to power the RTC. Capacitors have limited energy storage available, and thus during a power outage may only be able to provide power for the RTC for several hours.

Utility meters or their communication boards may employ batteries (potentially rechargeable batteries) to maintain the RTC operating during extended power outages. While batteries can generally maintain the RTC operating during even the longest reasonable power outage, batteries (generally one or more battery packs, typically lithium ion battery packs) are generally expensive and have a shorter field service life as compared to the utility meter necessitating field changeouts of the batteries. Changing batteries involves expenses not only to purchase replacement batteries, but also due to other related expenses involved in changing batteries including the cost of personnel associated with visiting each utility meter, entering a customer's premises, using a vehicle, and/or managing the inventory.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize for a utility meter lacking a battery, TOU and interval data quality is impacted because when the utility meter's power is restored after the utility meter is without power for a sufficient period of time, such as several hours, the utility meter will not know the correct time of the day. This means that while the utility meter can still sense and record energy usage (or usage of another commodity besides energy such as water), the utility meter cannot account for the usage of the energy or other commodity properly until it receives the correct time and date from an external source that is typically provided over a communication network that is communicably connected to. Quality disruptions in TOU and interval data streams may result in revenue loss for the utility because utility regulators may require assumptions about the meter data that generally favors the consumer. Additionally, utility regulators may impose penalties on the utility for having to estimate too much consumption data due to measurement quality problems. Utilities for their utility meters thus generally need to choose between expensive battery options for their utility meters or reduced meter data quality in the case of power outages.

One disclosed aspect comprises a utility meter that includes a consumption measurement unit for generating consumption data, a meter processor, and RTC coupled to the meter processor for time stamping of the consumption data to provide interval meter data during interval meter operation. A memory stores the interval meter data. The meter processor implements or initiates responsive to a power loss that suspends operation of the RTC, switching from interval meter operation to begin relative time operation.

During the relative time operation, the consumption data is stored as relative consumption data together with a relative time as relative meter data. Responsive to the power restored and receiving a current time, the utility meter switches from relative time to interval meter operation. The restoration time is calculated which corresponds to when the power was restored using the current time and an elapsed time since the restoration. The time of restoration together with the current time is used to generate calculated times, and then the consumption data obtained during the relative time operation is time stamped with the calculated times to provide time-corrected relative meter data which is stored in the same memory as used for storing the interval meter data.

DETAILED DESCRIPTION

Figure 1:
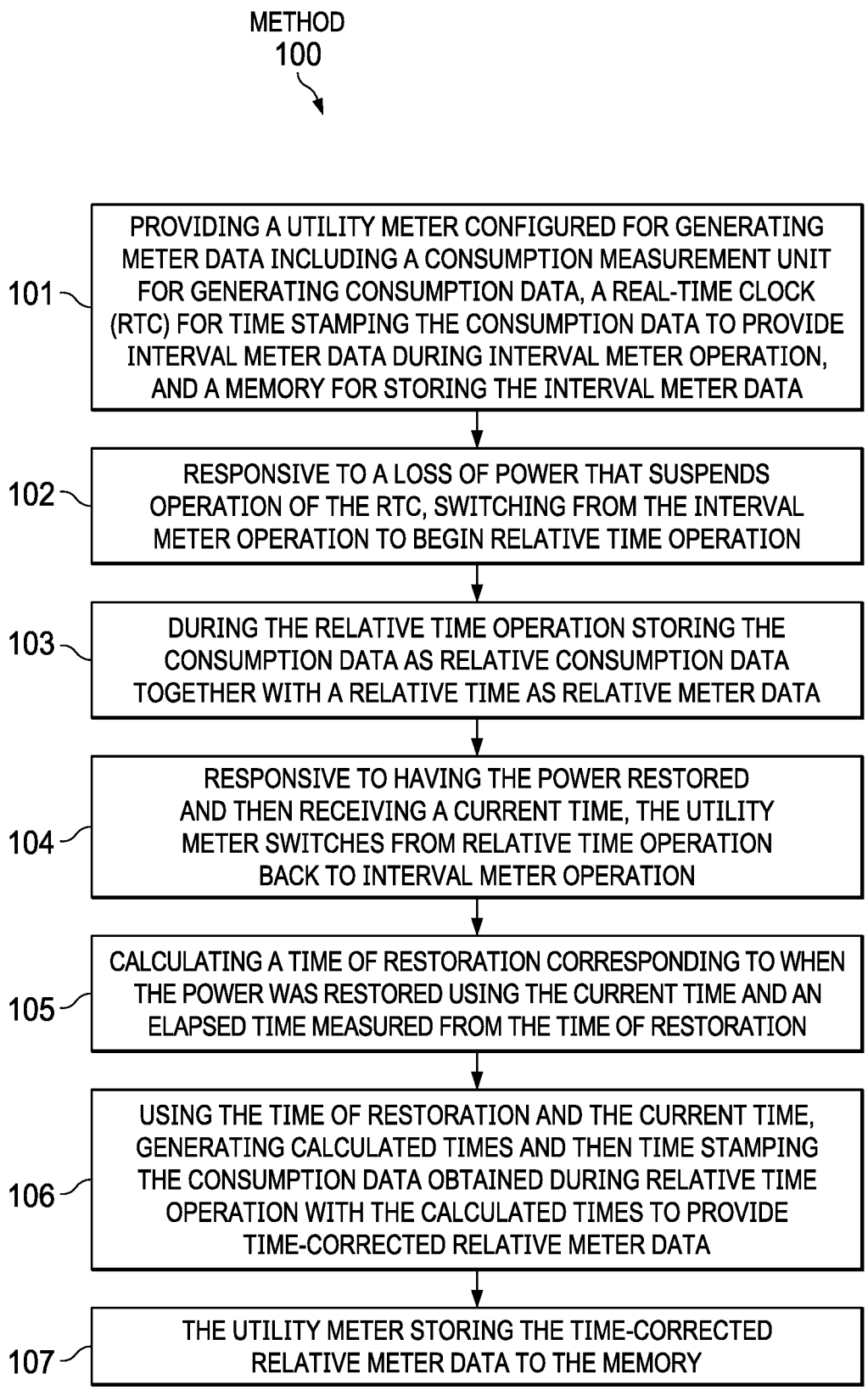
FIG. 1 is a flow chart that shows steps in an example method of operating a utility meter that generates interval data during a power outage without using a battery, according to an example aspect.

Disclosed aspects are described with reference to the attached figures, wherein like reference numerals are used throughout the figures to designate similar or equivalent elements. The figures are not drawn to scale and they are provided merely to illustrate certain disclosed aspects. Several disclosed aspects are described below with reference to example applications for illustration. It should be understood that numerous specific details, relationships, and methods are set forth to provide a full understanding of the disclosed aspects.

Disclosed aspects include a method of operating a utility meter that generates interval meter data (interval data) during a power outage without using a battery, including when the RTC of the utility meter cannot be maintained operational for time stamping the meter data. The method includes quantifying the measurement error of the consumption data of energy or another commodity such as water for a utility meter that is introduced when the RTC of the utility meter cannot be maintained powered over the duration of a power outage, and for also minimizing the measurement error.

The degree to which the measurement error can be minimized depends on computational resources available in the utility meter. A reasonable and practical electricity meter using disclosed aspects based on currently available technology, can be the Honeywell International A4 ALPHA METER, which can generally limit the worst-case measurement error of the utility meter to the amount of energy consumed in 1 second flowing through the utility meter. With additional computing resources (such as non-volatile storage within the utility meter), the measurement error can be made small enough to be within the range of time synchronization errors present in the communication network such as a local area network (LAN), to which the utility meter is generally communicably connected to, which can generally be an independently limiting factor.

Disclosed aspects generally only need to add a firmware algorithm and additional memory if needed to store the temporary high-resolution consumption data accumulated between a power restoration and time synchronization to the utility meter or its communication board in the case of a smart utility meter having a RF communications unit. Disclosed aspects do not require the utility meter to include a battery. The utility meter can include an optional storage capacitor to maintain operation of the RTC over relatively short duration power outages, such as for a few hours.

When the RTC of utility meter loses the time of the day due to a power outage, and then at a later time the utility meter's power is restored, the utility meter does not know how long the power outage has lasted, nor does it know the current time. The utility meter will generally be able to acquire the current time from an external source over a communications network that it is communicably coupled, such as another device or system on the communication network (e.g. a LAN) to which the utility meter is connected. For example, a 4G base station, private radio hub, or a general-purpose network time protocol (NTP) time protocol server accessible over the communications network can provide the current time to the utility meter at some time in the future, but this generally takes anywhere from seconds to hours depending on the communication network type and availability.

During this time without power provided to the utility meter so that the utility meter lacks the current time, the utility meter records the energy (or other commodity) consumption/usage rate at a higher resolution than it normally would for interval data when the RTC is normally operating so that it has the current time. Typical interval lengths for electricity meters are generally 5, 15, or 60 minutes with 5 and 15 minutes being common. During this time period that the utility meter lacked the current time, the utility meter was said to be operating on "relative time" because while it can accurately measure the passage of time, it does not know the correct current time.

During relative time operation, the utility meter captures energy or other commodity consumption data in small time quanta, such as every second. This consumption data obtained during relative time operation is generally stored in a memory someplace other than the memory where the normal consumption data storage obtained during interval meter operation is stored, that is, the consumption data obtained during relative time operation is not added to the memory generally utilized by the utility meter or consumption data being a typical TOU energy registers or put into a typical interval data log.

Since the utility meter measures the elapsed time beginning from the time of the restoration of power, once the utility meter leaves relative time operation after it has obtained the correct current time, the utility meter, using disclosed aspects, can work backwards to accurately time-stamp all the recorded 1-second (or whatever small time window is used) energy or other commodity consumption data measured during the period of relative time operation. The utility meter then applies those energy or other commodity usage amounts with their timestamp as time-corrected relative meter data to the memory where normal consumption data storage is stored, such as in one example TOU registers or an interval data log.

The time-corrected relative meter data is thus as though it had been recorded at the calculated times. The maximum error in these calculations is bounded by the resolution of the data. For example, with a 1 second resolution on the relative time data, the timestamps on the consumption data will be off by at most 1 second (+/−0.5 second). On average, the error will be 0.5 seconds. The error rate will generally be constant across all relative time records recorded by the utility meter during the same power outage.

The error rate will also be known to the utility meter. The error rate is generally known to the utility meter by comparing the change in the relative time clock to the corrected time once the time is set in the utility meter. This can involve the utility meter to be keeping time in units smaller than the smallest units of the corrected time. As an example, if the utility meter is recording one-minute intervals on relative time, then it is recording interval data at :00:00.000, :01:00.000, :02:00.000, etc. where the format here is (:<minutes>:<seconds>.<milliseconds>) and represents the RTC's time operating in relative time mode.

Consider that the correct time is received when the utility meter's clock (on relative time) reads 20:01:03.123 (HH:MM:SS.mmm) and the correct time (the time the utility meter's clock will be changed to) is 20:01:05.999, then the utility meter can correct the error in its relative time interval data timestamps as :05.999 minus :03.123=2.876 seconds. Once the utility meter changes the relative time timestamps on the recorded interval data to align with the new time reference, it is known that the error in the timestamps is (consistently) 2.876 seconds. The interval that later ends up timestamped as 20:01:00 was actually recorded between 20:00:02.876 and 20:01:02.876. This error rate could be used by downstream processing to assign a quality indication to the data such that, if the error was within acceptable limits, it would be considered as error-free data, and otherwise discarded as invalid.

Once the time-corrected relative meter data is applied to the memory where the normal consumption data storage during interval meter operation is stored (e.g., TOU registers and interval data log), metering of the commodity usage by the utility meter continues as before it entered relative time due to the power outage, with the next interval or TOU transition aligning precisely and accurately to clock boundaries. The time alignment is made accurate because the clock is now correct. For example, when the utility meter closes an interval at 2:15, it is actually 2:15. On "relative time" the utility meter closes the interval at 2:15 (it's clock) but it may actually be 3:37—so the clock boundary alignment is accurate when the meter's clock is deemed to be "correct".

FIG. 1 is a flow chart that shows steps in an example method 100 of operating a utility meter that generates interval data during a power outage without using a battery, according to an example aspect. Step 101 comprises providing a utility meter configured for generating meter data including a consumption measurement unit for generating consumption data, a RTC for time stamping the consumption data to provide interval meter data during interval meter operation, and a memory for storing the interval meter data. Step 102 comprises responsive to a loss of power that suspends operation of the RTC, switching from the interval meter operation to begin relative time operation.

Step 103 comprises during the relative time operation storing the consumption data as relative consumption data together with a relative time as relative meter data. The relative meter data generally uses a selected measurement interval that is at a higher resolution (shorter time period) as compared to a resolution of the interval meter data. Step 104 comprises responsive to having the power restored and then receiving a current time, the utility meter switches from the relative time operation back to the interval meter operation. Step 105 comprises calculating a time of restoration corresponding to when the power was restored using the current time and an elapsed time measured from the time of restoration.

Step 106 comprises using the time of restoration and the current time, generating calculated times and then time stamping the consumption data obtained during relative time operation with the calculated times to provide time-corrected relative meter data. The current time provided which is accurate, and the calculated time of restoration which is also accurate, enables the time-corrected relative meter data obtained during relative time operation to be accurately timestamped. Step 107 comprises the utility meter storing the time-corrected relative meter data to the memory. Thus, the time corrected relative meter data is as though the utility meter had directly recorded the consumption data using the RTC, which was instead replaced by the calculated times.

The method can further comprise quantifying an error rate of the time stamping of the consumption data during the relative time operation. The method can also further comprise before the storing, aggregating the consumption data obtained during the relative time operation with the calculated times after a predetermined time period. Aggregating the consumption data saves memory space in the utility meter. The utility meter can comprise an electricity meter, a fuel gas meter, a water meter, or an oil meter.

Disclosed aspects improve the state of the art for utility meters because it results in arbitrarily high-quality interval data without the materials cost or cost of ownership that comes with having the utility meter include a battery. However, as noted above, disclosed utility meters can include an energy storage capacitor(s).

Figure 2:
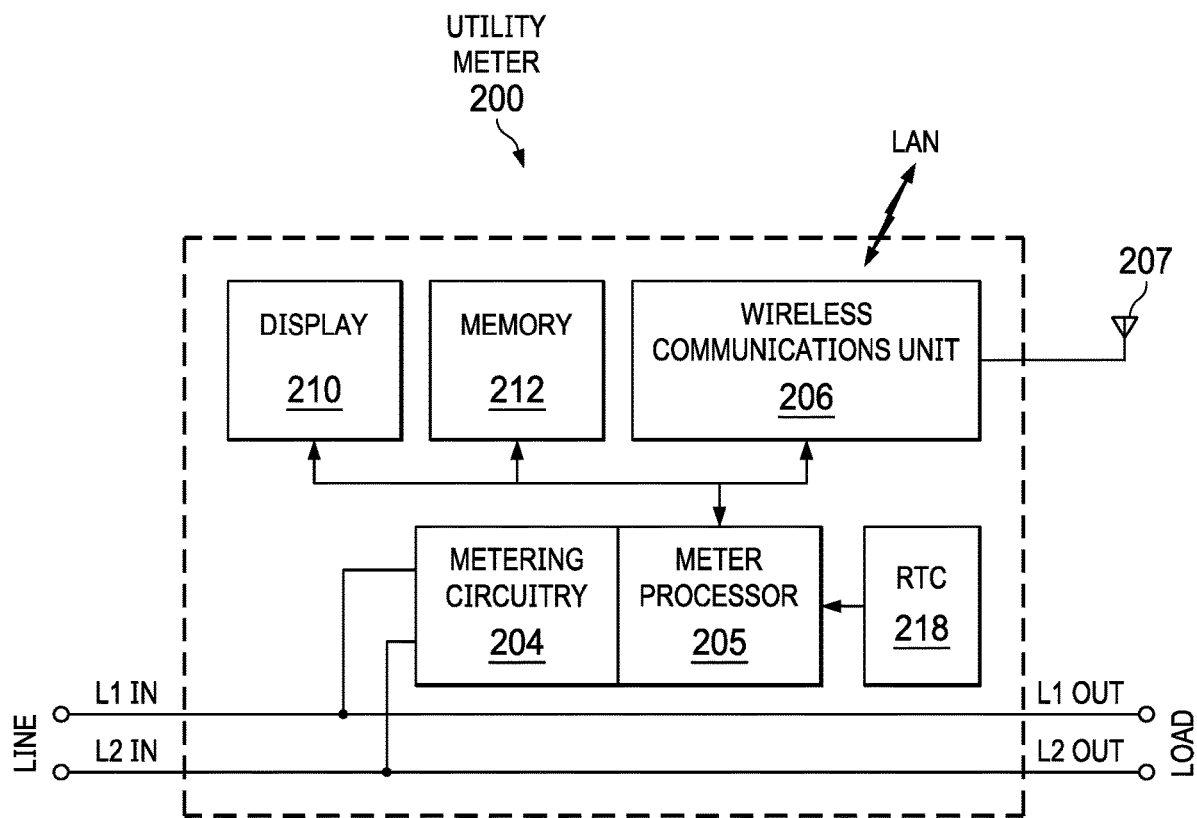
FIG. 2 is a block diagram representation of a utility meter that is configured to implement a disclosed method of operating a utility meter that generates interval data during a power outage without using a battery, according to an example aspect.

FIG. 2 is a block diagram of an example utility meter 200 that can implement disclosed aspects. As shown, the utility meter 200 comprises metering circuitry 204 for measuring the amount of a service or a commodity that is being consumed, a meter processor 205 such as a microprocessor or other computing device that can act to run algorithms and function as a controller to control the overall functions of the utility meter 200. A display 210 is generally included for displaying the meter data and status information. A memory 212 is for storing data including interval meter data obtained during interval meter operation, and the time-corrected relative meter data as described above that is generated by calculation using the time of power restoration and the current time. The memory 212 is also for storing program instructions.

The utility meter 200 is shown including a RTC 218 connected to the meter processor 205. The utility meter 200 further comprises wireless communications circuitry shown as a wireless communications unit 206, such as a transceiver coupled to an antenna 207, for transmitting and receiving data to/from other utility meters that may be equivalent to utility meter 200, or a collector which comprises meters operable to detect and record usage of a service or commodity such as, for example, electricity, water, and/or gas. The wireless communication unit 206 may comprise, for example, a CC1110Fx/CC1111fX semiconductor device available from Texas Instruments Incorporated® which comprises a Low-Power SoC (System-on-Chip) with MCU, memory, Sub-1 GHz RF Transceiver, and a USB controller.

EXAMPLES

Disclosed aspects are further illustrated by the following specific Examples, which should not be construed as limiting the scope or content of this Disclosure in any way.

For example, assume the utility meter is an electric meter that does not have a battery that is storing to its memory 1 second energy usage records during relative time operation using relative time due to loss of accurate timekeeping from its RTC sometime after a power outage. At some later time, the electric meter acquires the current time of 1/1/2018 03:04:12.5 from its communications network, such as from base station over a LAN, and the electric meter has been accumulating consumption data into the current record for 0.2 seconds, then the electric meter can accurately timestamp all previous 1 second consumption data records that are stored using the relative time:

03:04:12.3-03:04:12.5: the current energy consumption data accumulation;
03:04:11.3-03:04:12.3: the previous second's consumption data accumulation was over this period, and
03:04:10.3-03:04:11.3: the previous second's accumulation of consumption data was over this period.

This process can be continued analogously. Since utility meters, such as electric meters, generally need to report meter data on even clock boundaries, these timestamps cannot generally be reported as is. Instead the consumption data values generally need to be aggregated into 1, 5, 15, or 60-minute periods. Assuming the electric meter was on relative time for more than 15 minutes in the example above the measurements from the time interval 03:00:00.3-03:15:00.3 can be aggregated into the 03:00-03:15 interval and added to the memory in the utility meter (e.g., the TOU register) that corresponds to the consumption data usage during this period. Assuming the memory rate did not change during this interval simplifies this example, where if the memory schedule defines an on-peak and off-peak period of the day, this example assumes that transition from one memory rate to the other did not occur during the relative time period.

In this case, the time error for the 03:00-03:15 interval is 0.3 seconds, or 0.04% of the 15-minute interval. If the electric meter is recording 5-minute interval data, the time error for each 5-minute interval recorded during relative time operation using relative time in this example would be 0.1%. Aggregating the relative time data over longer time intervals thus results in a lower average time error. Likewise, recording consumption data in 0.1 second intervals while on relative time would result in 0.005% average time error for 15-minute data.

| Average time error rates | 5-minute interval length | 15-minute interval length | 60-minute interval length |
|---|---|---|---|
| 0.1 second resolution | 0.01667% | 0.0056% | 0.0014% |
| 1 second resolution | 0.1667% | 0.0556% | 0.0138% |
| 10 second resolution | 1.6667% | 0.5556% | 0.1389% |
| 1-minute resolution | 10.000% | 3.3333% | 0.8333% |

Disclosed aspects can be implemented by firmware stored in a memory of the utility meter, in one arrangement operating in an electricity meter that includes a storage capacitor to maintain the RTC over typical outage durations (a few hours) so that the need to apply disclosed methods would be reduced (storage capacitors allow for zero-error timekeeping). Other related functions the utility meter can implement based on disclosed aspects include keeping track of the quantified time error so that more powerful analytics or future algorithms can improve upon the results, tracking cumulative time error during a billing period in case the utility meter entered relative time more than once per billing period, and in one arrangement using heuristics to improve the accuracy of accounting for the relative time data.

Because the worst-case error is smaller with higher resolution data capture in relative time, the utility meter should generally use every method available to capture consumption data at the highest practical resolution. Increased data capture resolution does increase the data storage requirements in the memory of the utility meter. As part of disclosed aspects, the utility meter can monitor its storage usage and automatically resample the consumption data at a lower resolution after some time in order to reduce the data storage requirements. For example, the utility meter can store 0.1 second resolution data for the first hour on relative time, and then aggregate that data into 1 second data (by summing each 10 0.1 second values) to compress the memory space required for longer duration outages. This or similar heuristic gives optimal performance (minimal error) given fixed resources as is typical on electricity meters.

Believed to be new aspects disclosed herein include accumulation of meter data in relative time at a higher resolution than the resolution normally used for interval data. Aggregation of the relative time meter data into the memory used for the interval data is another. The retroactive aggregation of the relative time meter data into interval data records is another. The quantification of the error rate by the utility meter is another. The aggregation of the meter data after a certain time period to save memory space in the utility meter's memory is another. The interval data produced still has clock-boundary aligned timestamps and otherwise is not different than normal interval data is believed to be yet another new disclosed aspect. Moreover, as there is no battery needed for disclosed utility meters, no battery maintenance is needed, and lower cost capacitors as compared to batteries may be able to be used by the utility meter.

While various disclosed aspects have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

The invention claimed is:

1. A method, comprising:
providing a utility meter configured to generate meter data including a consumption measurement unit configured to generate consumption data, a real-time clock (RTC) configured to time stamp the consumption data to provide interval meter data during interval meter operation, and a memory configured to store the interval meter data;
determining that the RTC has lost power;
suspending operation of the RTC with loss of power;
switching from the interval meter operation to relative time operation in response to the suspended operation of the RTC;
during the relative time operation, storing the consumption data as relative consumption data together with a relative time as relative meter data, wherein the relative meter data uses a selected measurement interval that is at a higher resolution as compared to a resolution of the interval meter data;
determining that the power has been restored;
switching from the relative time operation back to interval meter operation;
receiving a current time in response to a restored RTC operation;
calculating a time of restoration corresponding to when the power was restored using the current time and an elapsed time since the time of restoration;
using the time of restoration and the current time, generating calculated times and then time stamping the consumption data obtained during relative time operation with the calculated times to provide time-corrected relative meter data, and
the utility meter storing the time-corrected relative meter data to the memory.

2. The method of claim 1, further comprising quantifying an error rate of the time stamping of the consumption data during the relative time operation.

3. The method of claim 2, wherein the error rate is known to the utility meter by comparing the change in a relative time clock to the calculated times once the time is set in the utility meter.

4. The method of claim 1, further comprising before the storing, aggregating the consumption data obtained during the relative time operation with the calculated times after a predetermined time period.

5. The method of claim 1, wherein the utility meter comprises an electricity meter, a fuel gas meter, a water meter, or an oil meter.

6. The method of claim 1, wherein the utility meter includes a wireless communications unit coupled to an antenna, and wherein the current time is received by the wireless communications unit.

7. The method of claim 1, wherein the utility meter is exclusive of a battery.

8. The method of claim 1, wherein the utility meter includes an optional storage capacitor to maintain operation of the RTC over relatively short duration power outages.

9. The method of claim 1, further comprising applying the time-corrected relative meter data to the memory where the consumption data is stored during the interval meter operation while metering of the usage by the utility meter continues as before the loss of power.

10. A utility meter, comprising:
a consumption measurement unit configured to generate consumption data;
a meter processor coupled to a memory;
a real-time clock (RTC) coupled to the meter processor configured to provide a time for time stamping of the consumption data to provide interval meter data during interval meter operation;
the memory configured to store the interval meter data during interval meter operation;
the meter processor configured to implement or initiate:
responsive to a loss of power that suspends operation of the RTC, switching from the interval meter operation to begin relative time operation;
during the relative time operation storing the consumption data as relative consumption data together with a relative time as relative meter data, wherein the relative meter data uses a selected measurement interval that is at a higher resolution as compared to a resolution of the interval meter data;
responsive to having the power restored and then receiving a current time, the utility meter switching from the relative time operation back to the interval meter operation;
calculating a time of restoration corresponding to when the power was restored using the current time and an elapsed time since the time of restoration;
using the time of restoration and the current time, generating calculated times and then time stamping the consumption data obtained during the relative time operation with the calculated times to provide time-corrected relative meter data, and
storing the time-corrected relative meter data to the memory.

11. The utility meter of claim 10, wherein the meter processor further implements quantifying an error rate of the time stamping of the consumption data during the relative time operation.

12. The utility meter of claim 10, wherein the meter processor further implements before the storing, aggregating the consumption data obtained during the relative time operation with the calculated times after a predetermined time period.

13. The utility meter of claim 10, wherein the wherein the utility meter comprises an electricity meter, a fuel gas meter, a water meter, or an oil meter.

14. The utility meter of claim 10, wherein the utility meter further comprises a wireless communications unit coupled to an antenna, and wherein the current time is received by the wireless communications unit over a wireless network.

15. The utility meter of claim 10, wherein the utility meter is exclusive of a battery.

16. The utility meter of claim 10, wherein the utility meter includes an optional storage capacitor to maintain operation of the RTC over relatively short duration power outages.

17. The utility meter of claim 10, wherein the meter processor further applies the time-corrected relative meter data to the memory where the consumption data is stored during the interval meter operation while metering of the usage by the utility meter continues as before the loss of power.

18. A utility meter, comprising:
a consumption measurement unit configured to generate consumption data;
a meter processor coupled to a memory;
a real-time clock (RTC) coupled to the meter processor configured to provide a time for time stamping of the consumption data to provide interval meter data during interval meter operation;
the memory configured to store the interval meter data during interval meter operation;
wherein utility meter is exclusive of a battery;
the meter processor configured to implement or initiate:
responsive to a loss of power that suspends operation of the RTC, switching from the interval meter operation to begin relative time operation;
during the relative time operation storing the consumption data as relative consumption data together with a relative time as relative meter data; wherein the relative meter data uses a selected measurement interval that is at a higher resolution as compared to a resolution of the interval meter data;
responsive to having the power restored and then receiving a current time, the utility meter switching from the relative time operation back to the interval meter operation;
calculating a time of restoration corresponding to when the power was restored using the current time and an elapsed time since the time of restoration;
using the time of restoration and the current time, generating calculated times and then time stamping the consumption data obtained during the relative time operation with the calculated times to provide time-corrected relative meter data, and
storing the time-corrected relative meter data to the memory.

* * * * *